(12) United States Patent
Saito

(10) Patent No.: US 9,407,812 B2
(45) Date of Patent: Aug. 2, 2016

(54) IMAGE PICKUP APPARATUS CAPABLE OF PERFORMING AUTOFOCUS CONTROL IN RESPONSE TO OUTPUT OF IMAGE PICKUP DEVICE, CONTROL METHOD THEREFOR, AND STORAGE MEDIUM STORING CONTROL PROGRAM THEREFOR

(71) Applicant: CANON KABUSHIKI KAISHA, Tokyo (JP)

(72) Inventor: Junichi Saito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/636,887

(22) Filed: Mar. 3, 2015

(65) Prior Publication Data

US 2015/0256737 A1 Sep. 10, 2015

(30) Foreign Application Priority Data

Mar. 5, 2014 (JP) .................................. 2014-042635

(51) Int. Cl.
*H04N 5/232* (2006.01)
*H04N 5/369* (2011.01)
*G03B 13/36* (2006.01)
*G02B 7/34* (2006.01)

(52) U.S. Cl.
CPC .............. *H04N 5/23212* (2013.01); *G02B 7/34* (2013.01); *H04N 5/23219* (2013.01); *H04N 5/3696* (2013.01); *G03B 13/36* (2013.01)

(58) Field of Classification Search
None
See application file for complete search history.

(56) References Cited

U.S. PATENT DOCUMENTS

| | | | | |
|---|---|---|---|---|
| 6,229,568 B1 * | 5/2001 | Kawaguchi | ........ | H04N 5/23212 348/345 |
| 7,327,890 B2 * | 2/2008 | Fredlund | .............. | G06K 9/3233 348/E5.047 |
| 7,734,098 B2 * | 6/2010 | Kikkawa | ................... | G06T 5/00 348/231.3 |
| 8,525,921 B2 * | 9/2013 | Kosaka | .................. | G03B 13/36 348/222.1 |
| 8,576,329 B2 * | 11/2013 | Takamiya | ................ | G02B 7/34 348/349 |

(Continued)

FOREIGN PATENT DOCUMENTS

JP 58-024105 A 2/1983

*Primary Examiner* — Michael Osinski
(74) *Attorney, Agent, or Firm* — Cowan, Liebowitz & Latman, P.C.

(57) ABSTRACT

An image pickup apparatus that is capable of performing a focusing control with sufficient accuracy without restricting a settable range of a focus detection area. An image pickup device has pixels each of which has sub-pixels that receive light beams passing through different pupil areas. A correlation operation area including a focus detection area and a shift area is set in an image indicated by an output from the image pickup device. A defocus amount is calculated in response to a correlation amount found by applying a shift process to image signals from the sub-pixels. If the focus detection area is set at a position where the correlation operation area is set with a default width, the shift area is set with a predetermined width. Otherwise the shift area is set with a narrower width and the correlation operation area is set with a width narrower than the default width.

11 Claims, 14 Drawing Sheets

(56) References Cited

U.S. PATENT DOCUMENTS

| | | | |
|---|---|---|---|
| 9,100,567 B2* | 8/2015 | Nagaoka | H04N 5/23212 |
| 9,109,891 B2* | 8/2015 | Yamato | G01C 11/06 |
| 9,219,856 B2* | 12/2015 | Akamatsu | G03B 13/36 |
| 2002/0122121 A1* | 9/2002 | Fujii | H04N 5/23212 |
| | | | 348/240.2 |
| 2003/0118100 A1* | 6/2003 | Honda | H04N 19/61 |
| | | | 375/240.08 |
| 2005/0128312 A1* | 6/2005 | Fredlund | H04N 1/02409 |
| | | | 348/222.1 |
| 2006/0072915 A1* | 4/2006 | Onozawa | G02B 7/28 |
| | | | 396/121 |
| 2008/0080739 A1* | 4/2008 | Muramatsu | G03B 35/18 |
| | | | 382/103 |
| 2009/0073304 A1* | 3/2009 | Kumagai | G03B 13/30 |
| | | | 348/345 |
| 2011/0007176 A1* | 1/2011 | Hamano | H04N 5/23212 |
| | | | 348/222.1 |
| 2013/0063571 A1* | 3/2013 | Ishii | G06T 15/205 |
| | | | 348/47 |
| 2013/0162839 A1* | 6/2013 | Yoneyama | H04N 5/23212 |
| | | | 348/169 |
| 2014/0071303 A1* | 3/2014 | Hasegawa | H04N 5/23287 |
| | | | 348/208.11 |
| 2014/0111628 A1* | 4/2014 | Yoshino | H04N 5/23296 |
| | | | 348/65 |
| 2014/0211059 A1* | 7/2014 | Aoki | G02B 7/34 |
| | | | 348/311 |
| 2014/0218593 A1* | 8/2014 | Yamada | G03B 13/36 |
| | | | 348/349 |
| 2014/0313371 A1* | 10/2014 | Sambonsugi | G03B 13/36 |
| | | | 348/231.6 |
| 2014/0354781 A1* | 12/2014 | Matsuyama | H04N 5/23212 |
| | | | 348/49 |
| 2015/0054978 A1* | 2/2015 | Shibagami | G02B 7/365 |
| | | | 348/222.1 |
| 2015/0092101 A1* | 4/2015 | Yamazaki | G02B 7/282 |
| | | | 348/353 |
| 2015/0181106 A1* | 6/2015 | Komori | H04N 5/23212 |
| | | | 348/349 |
| 2015/0181196 A1* | 6/2015 | Izawa | G03B 13/18 |
| | | | 348/46 |
| 2016/0044230 A1* | 2/2016 | Yoshimura | H04N 9/646 |
| | | | 348/353 |

* cited by examiner

IMAGE PICKUP APPARATUS CAPABLE OF PERFORMING AUTOFOCUS CONTROL IN RESPONSE TO OUTPUT OF IMAGE PICKUP DEVICE, CONTROL METHOD THEREFOR, AND STORAGE MEDIUM STORING CONTROL PROGRAM THEREFOR

BACKGROUND OF THE INVENTION

1. Field of the Invention

The present invention relates to an image pickup apparatus that performs autofocus (AF) control in response to an output of an image pickup device, a control method therefore, and a storage medium that stores a control program therefor.

2. Description of the Related Art

In general, a focus detection method with imaging surface phase difference detection using focus detection pixels of an image pickup device is known as one of focus detection methods in an image pickup apparatus like a digital still camera.

For example, an image pickup device that has at least a pair of sensors (i.e., photoelectric conversion elements) for a micro lens provided for each pixel is known as an image pickup device that performs the imaging surface phase difference detection (see Japanese laid-open patent publication (Kokai) No. S58-24105 (JP S58-24105)).

In the focus detection with the imaging surface phase difference detection, a pair of image signals in different pupil areas are used, and a correlation operation process by which a correlative value between the image signals is calculated one by one while shifting the image signals relatively is performed. An in-focus position is found according to a shift amount with the highest correlative value as a defocus amount. Then, a focusing control is performed according to the defocus amount concerned.

FIG. 15A and FIG. 15B are views showing focus detection by the imaging surface phase difference detection in a conventional image pickup apparatus. FIG. 15A is a view showing a focus detection area and shift areas that are arranged in an image pickup area. FIG. 15B is a view showing a settable range of the focus detection area. It should be noted that the focus detection area (A) and the shift areas (B) are collectively called a correlation operation area in the following description.

In the example shown in FIG. 15A, the focus detection area (A) 1502 is arranged in the center of a screen 1501. The shift areas (B) 1503 that are used for reading and correlation operations are adjacently arranged at both sides of the focus detection area (A) 1502 in a horizontal direction.

In the correlation operation process, adjacent areas of the focus detection area (A) 1502 are secured as the shift areas (B) 1503 in addition to the focus detection area (A) 1502, and the shift process of a predetermined amount (an amount corresponding the twice of the width of the shift area (B) 1503 in this example) is performed. Then, whenever the shift process is performed, the correlation operation is performed to calculate the defocusing amount for the focusing control.

Incidentally, since the shift areas (B) 1503 are set at the both sides of the focus detection area (A) 1502, a settable range 1504 (indicated by an alternate long and short dash line in FIG. 15B) within which the focus detection area (A) 1502 is settable becomes narrower than the screen 1501, which is an image pickup area, by the width of the shift area (B) 1503 (see FIG. 15B).

As mentioned above, in the conventional image pickup apparatus, a correlation operation process cannot be always performed in the entire image pickup area because the settable range of the focus detection area is restricted in the image pickup area. Accordingly, the conventional image pickup apparatus is difficult to perform the focusing control with sufficient accuracy over the entire image pickup area.

SUMMARY OF THE INVENTION

The present invention provides an image pickup apparatus, a control method therefor, and a storage medium that stores a control program therefor, which are capable of performing a focusing control with sufficient accuracy without restricting a settable range of a focus detection area set in an image pickup area.

Accordingly, a first aspect of the present invention provides an image pickup apparatus including an image pickup device on which pixels each of which is provided with a plurality of sub-pixels that respectively receive light beams passing through different pupil areas of an imaging optical system are arranged two-dimensionally, an area setting unit configured to set a target area for detecting a defocus amount as a focus detection area in an image indicated by an image signal output from the image pickup device, to set at least one shift area for calculating a correlation amount of image signals output from the plurality of sub-pixels, and to define a correlation operation area including the focus detection area and the at least one shift area, a focus detection unit configured to find the correlation amount by applying a shift process to image signals output from the plurality of sub-pixels, and to calculate the defocus amount in response to the correlation amount concerned, and a control unit configured to set the width of the at least one shift area to a predetermined width when the focus detection area is set at a position where the correlation operation area can be set with a first width in the image, and to set the width of the at least one shift area to a width narrower than the predetermined width to set the width of the correlation operation area to a second width narrower than the first width when the focus detection area is set at a position where the correlation operation area cannot be set with the first width.

Accordingly, a second aspect of the present invention provides a control method for an image pickup apparatus having an image pickup device on which pixels each of which is provided with a plurality of sub-pixels that respectively receive light beams passing through different pupil areas of an imaging optical system are arranged two-dimensionally, and detecting a focusing state based on an output of the image pickup device, the control method including an area setting step of setting a target area for detecting a defocus amount as a focus detection area in an image indicated by an image signal from the image pickup device, of setting at least one shift area for calculating a correlation amount of image signals output from the plurality of sub-pixels, and of defining a correlation operation area including the focus detection area and the at least one shift area, a focus detection step of finding the correlation amount by applying a shift process to image signals output from the plurality of sub-pixels, and calculating the defocus amount in response to the correlation amount concerned, and a control step of setting the width of the at least one shift area to a predetermined width when the focus detection area is set at a position where the correlation operation area can be set with a first width in the image, and of setting the width of the at least one shift area to a width narrower than the predetermined width to set the width of the correlation operation area to a second width narrower than the first width when the focus detection area is set at a position where the correlation operation area cannot be set with the first width.

Accordingly, a third aspect of the present invention provides a non-transitory computer-readable storage medium storing a control program causing a computer to execute the control method of the second aspect.

According to the present invention, when the focus detection area is set at a position where the correlation operation area can be set with the first width in the image pickup area, the width of the shift area becomes a predetermined width. When the focus detection area is set at a position where the correlation operation area cannot be set with the first width, the width of the shift area becomes narrower than the predetermined width and the width of the correlation operation area becomes the second width smaller than the first width. Accordingly, the focusing control is performed with sufficient accuracy without restricting the settable range of the focus detection area set in the image pickup area.

Further features of the present invention will become apparent from the following description of exemplary embodiments with reference to the attached drawings.

DESCRIPTION OF THE EMBODIMENTS

Hereafter, embodiments according to the present invention will be described in detail with reference to the drawings.

Figure 1:
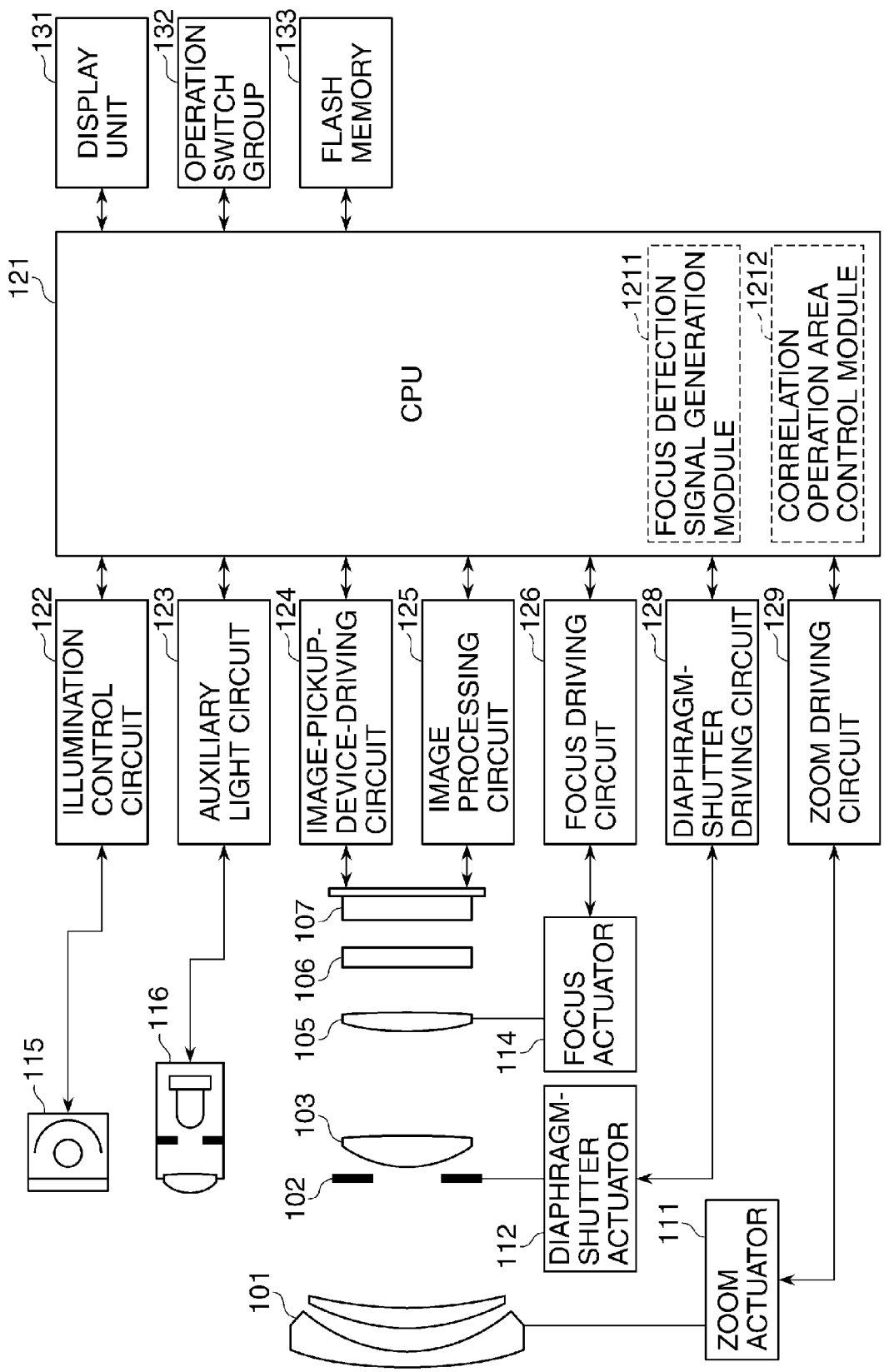
FIG. 1 is a block diagram schematically showing a configuration of an image pickup apparatus according to a first embodiment of the present invention.

FIG. 1 is a block diagram schematically showing a configuration of an image pickup apparatus according to a first embodiment of the present invention.

The illustrated image pickup apparatus is a digital camera (referred to as a camera, hereafter) that has an imaging optical system. The imaging optical system is provided with a first lens group 101, a diaphragm shutter 102, a second lens group 103, a third lens group 105, and an optical low pass filter 106, which are arranged in order from a subject side. The first lens group 101 is held so as to move along an optical axis.

The diaphragm shutter 102 and the second lens group 103 are united and are held so as to move along the optical axis.

The third lens group 105 is also held so as to move along the optical axis. The optical low pass filter 106 is used to reduce false color and moire in a picked-up image. An image pickup device 107 is provided with a two-dimensional CMOS photosensor and its peripheral circuitry, for example, and is arranged in an imaging plane of the imaging optical system.

A zoom actuator 111 rotates a cam barrel (not shown) to move the first lens group 111 and the second lens group 103 along the optical axis, and changes magnification. A diaphragm-shutter actuator 112 controls an aperture diameter of the diaphragm shutter 102 to control a light amount (photographing light amount) at the time of photographing, and controls exposure time by using the diaphragm shutter 102 as a shutter for adjusting the exposure time. A focus actuator 114 moves the third lens group 105 along the optical axis to adjust focus.

A subject illuminating device 115 is selectively used at the time of photographing. The subject illuminating device 115 is provided with a flash light source like a xenon tube, for example. However, the subject illuminating device 115 may be provided with an LED that continuously emits light. An AF auxiliary light unit 116 projects an image of a mask that has a predetermined opening pattern to a field through a projection lens in order to raise a focus detection ability with respect to a dark subject or a low contrast subject.

A CPU 121 controls the entire camera and has an operation unit, a ROM, a RAM, an A/D converter, a D/A converter, a communication interface circuit, and the like that are not shown. Then, the CPU 121 executes a series of actions, such as auto focusing (AF), photographing, image processing, and image recording, by controlling the camera based on a predetermined program stored in the ROM.

An illumination control circuit 122 controls an emission of the subject illuminating device 115 in synchronization with a photographing action. An auxiliary light circuit 123 controls an emission of the AF auxiliary light unit 116 in synchronization with a focus detecting operation. An image-pickup-device-driving circuit 124 controls an image pickup action of the image pickup device 107, applies an A/D conversion to an image signal that is output from the image pickup device 107, and transmits the converted digital signal to the CPU 121.

An image processing circuit 125 applies image processes, such as γ conversion, color interpolation, and JPEG compression, to the image signal that is output from the image pickup device 107. A focus driving circuit 126 controls and drives the focus actuator 114 on the basis of the focus detection result obtained by the CPU 121. As a result of this, the focus actuator 114 moves the third lens group 105 along the optical axis to adjust focus.

A diaphragm-shutter driving circuit 128 controls and drives the diaphragm-shutter actuator 112 to control the aperture diameter of the diaphragm shutter 102. A zoom driving circuit 129 drives the zoom actuator 111 according to a zoom operation by a photographer.

A display unit 131 is an LCD, for example. The display unit 131 displays mode information about a photographing mode of the camera, a preview image before photographing, a review image after photographing, a focusing state displaying image, etc. An operation switch group 132 includes a power switch, a release (photographing trigger) switch, a zoom operation switch, a photographing mode selection switch, etc. A flash memory 133 that is detachable to the camera records the image data photographed.

As shown in FIG. 1, functions of the CPU 121 include a focus detection signal generation module 1211 and a correlation operation area control module 1212. A focus detection module (not shown) is also included in the functions of the CPU 121. The focus detection signal generation module 1211 generates below-mentioned first and second focus detection signals according to the image signal (the digital image signal transmitted from the image-pickup-device driving circuit 124) that is output from the image pickup device 107. The correlation operation area control module 1212 sets a width of a correlation operation area mentioned later. Then, the focus detection unit executes a shift process mentioned later.

Figure 2:
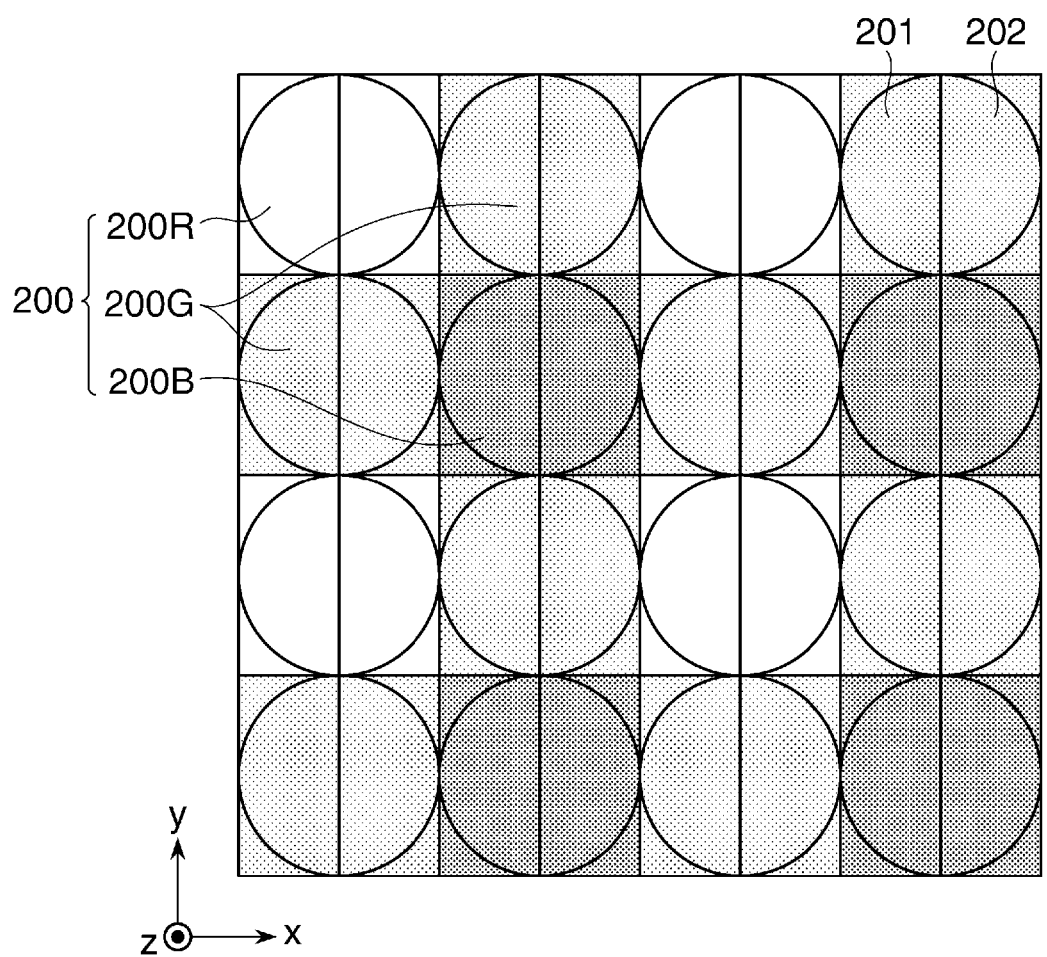
FIG. 2 is a view showing an example of a pixel arrangement in the image pickup device shown in FIG. 1.

FIG. 2 is a view showing an example of a pixel arrangement in the image pickup device 107 shown in FIG. 1.

The image pickup device 107 shown in FIG. 2 has a plurality of pixels arranged in a two-dimensional matrix form. Here, an arrangement of the pixels in an area of 4 lines×4 columns in the two-dimensional CMOS sensor (the image pickup device) is shown. In the same area, sub-pixels (focus detection pixels) are arranged in a form of 4 lines×8 columns. Many pixel groups each of which consists of the pixels in the area of 4 lines×4 columns shown in FIG. 2 are arranged on the image pickup device 103, and the image pickup device 107 outputs an image signal corresponding to an optical image. It should be noted that each pixel consists of a pair of sub-pixels (focus detection pixels) in the illustrated example.

A pixel period P of the image pickup device 107 is 4 μm, and, its pixel number N is about 20,750,000 (=5575 columns×3725 lines), for example. Then, a column-direction period PAF of the focus detection pixel is 2 μm, and a focus detection pixel number NAF is about 41,500,000 (=11150 columns×3725 lines).

In a pixel group 200 in an area of 2 columns×2 lines in FIG. 2, a pixel 200R that has spectral sensitivity in a R (red) region is arranged at an upper left corner, and pixels 200G that have spectral sensitivity in a G (green) region are arranged at a right side and a lower side of the pixel 200R. Moreover, a pixel 200B that has the spectral responsivity of B (blue) is arranged at the lower right of the pixel 200R. Furthermore, each pixel is divided in a first direction (y-direction) by a first division number N1 and is divided in a second direction (x-direction) by a second division number N2. The divided areas (focus detection pixels) are two-dimensionally arranged. In this embodiment, N1 is "1" and N2 is "2". As a result, a first focus detection pixel 201 and a second focus detection pixel 202 are arranged in each pixel.

Figure 3A:
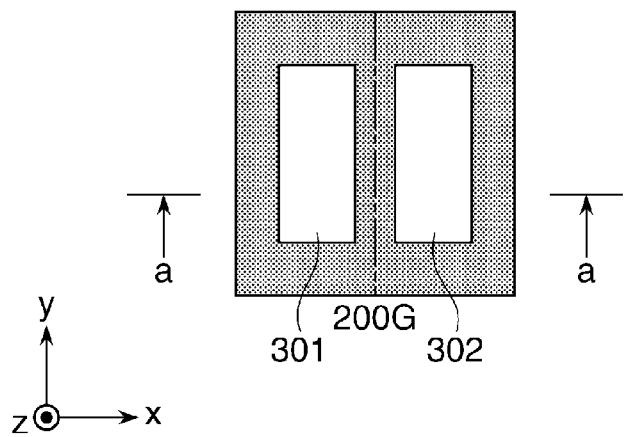
FIG. 3A is a plan view showing a configuration of a pixel shown in FIG. 2 viewed from a light receiving surface side.
Figure 3B:
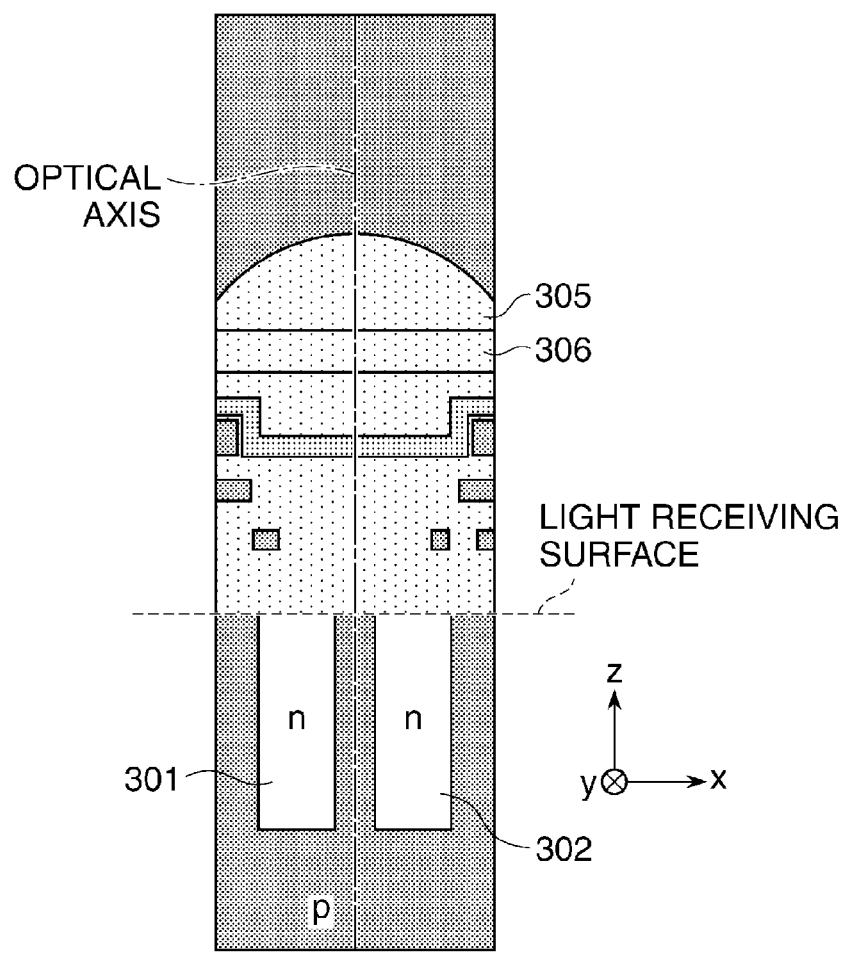
FIG. 3B is a cross sectional view taken along a-a line in FIG. 3A.

FIG. 3A and FIG. 3B are views showing the pixel 200G shown in FIG. 2. FIG. 3A is a plan view showing the pixel 200G viewed from the light receiving surface side (+z side) of the image pickup device 107. FIG. 3B is a view showing a cross section of the pixel 200 taken along a line a-a in FIG. 3A viewed from −y side.

As shown in FIG. 3A, the pixel 200G is divided into NV divisions (one division) in the y-direction, and is divided into NH divisions (two divisions) in the x-direction that intersects perpendicularly with the y-direction. As a result, a photoelectric conversion section 301 and a photoelectric conversion section 302 are formed in an arrangement of NV×NH (1×2). It should be noted that the photoelectric conversion section 301 and the photoelectric conversion section 302 respectively correspond to the first focus detection pixel 201 and the second focus detection pixel 202 shown in FIG. 2. Moreover, the other pixels are also divided similarly.

As shown in FIG. 3B, each of the photoelectric conversion sections 301 and 302 is a pin photodiode that sandwiches an intrinsic layer between a p-layer and an n-layer, for example. A PN junction photodiode that omits an intrinsic layer may be employed if needed.

Furthermore, a micro lens (ML) 305 for condensing an incident light beam is formed at the subject side of the photoelectric conversion sections 301 and 302. Then, a color filter 306 is formed between the micro lens 305 and the photoelectric conversion sections 301 and 302. Furthermore, the spectral transmittance of the color filter may differ from each sub-pixel (focus detection pixel), and the color filter may be omitted if needed.

The incident light beam to the pixel 200G is condensed with the micro lens 305 shown in FIG. 3B, is spectrally dispersed by the color filter 306, and is received by the photoelectric conversion section 301 and the photoelectric conversion section 302. In the photoelectric conversion sections 301 and 302, electrons and holes that are generated according to the receiving light amount are separated in depletion layers, the negatively charged electrons are accumulated in the n-layers (not shown). On the other hand, the holes are discharged to outside of the image pickup device through the p-layer connected to a constant-voltage source (not shown). The electrons accumulated in the n-layers (not shown) of the photoelectric conversion sections 301 and 302 are transmitted to an electrostatic capacitance through a transfer gate, and are converted into voltage signals.

Figure 4:
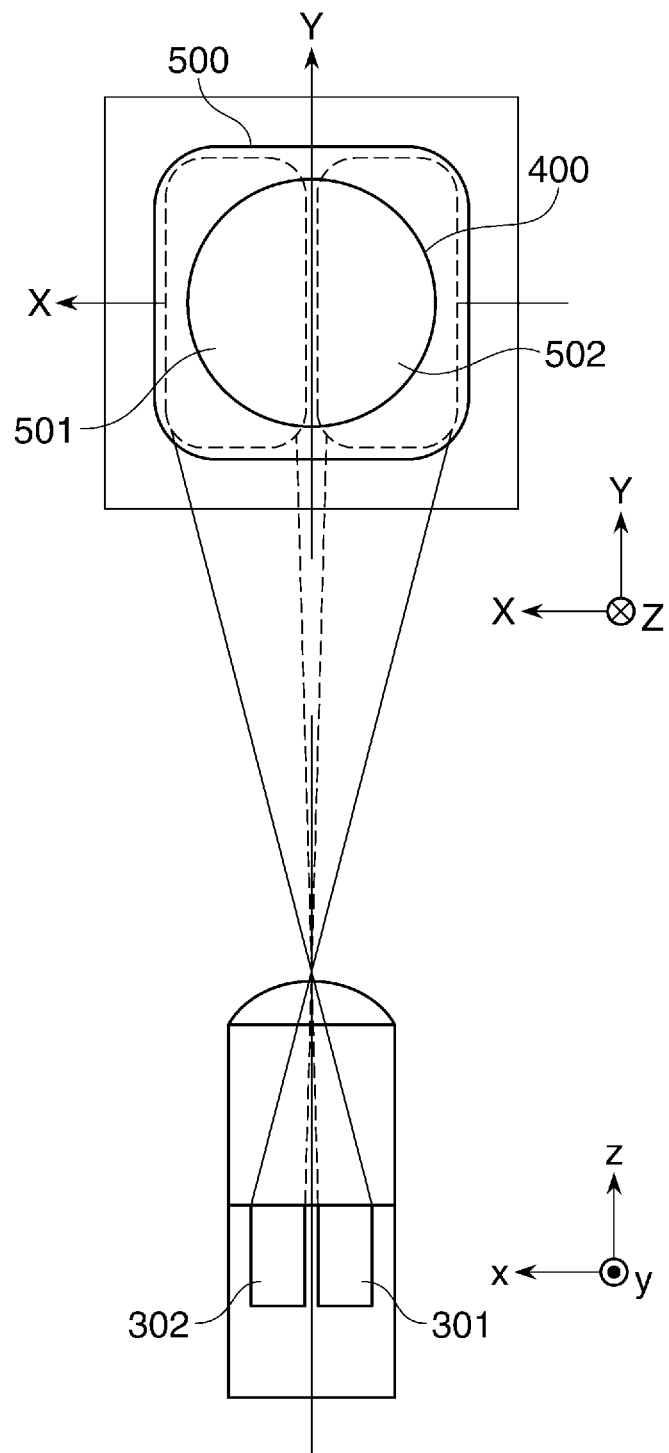
FIG. 4 is a view showing a correspondence between the configuration of the pixel shown in FIG. 3A and FIG. 3B and pupil division.

FIG. 4 is a view showing a correspondence between the configuration of the pixel shown in FIG. 3A and FIG. 3B and pupil division.

FIG. 4 shows the cross section shown in FIG. 3B viewed from the +y side and an exit pupil plane that is parallel to the x-y plane.

The image pickup device 107 is arranged near the imaging plane of the imaging optical system. A light beam from a subject passes an exit pupil 400 of the imaging optical system and enters into each pixel. The micro lens 305 makes the first partial pupil region 501 and the second partial pupil region 502 be approximately conjugate with the light receiving surfaces of the photoelectric conversion section 301 and the photoelectric conversion section 302, respectively, that are divided into 1×2 (i.e., the first focus detection pixel 201 and the second focus detection pixel 202). Accordingly, the light beams passing through the pupil regions 501 and 502 are respectively received by the photoelectric conversion sections (sub-pixels).

That is, the first partial pupil region 501 is approximately conjugated with the light receiving surface of the photoelectric conversion section 301 of which the center of gravity is decentered in the −x direction. The center of gravity of the first partial pupil region 501 is decentered in the +x direction on the exit pupil 400. Similarly, the second partial pupil region 502 is approximately conjugated with the light receiving surface of the photoelectric conversion section 302 of which the center of gravity is decentered in the +x direction. The center of gravity of the second partial pupil region 502 is decentered in the −x direction on the exit pupil 400.

Moreover, a pupil area 500 corresponds to a light receiving area in the entire pixel 200G that consists of the photoelectric conversion section 301 and the photoelectric conversion section 302 (the first focus detection pixel 201 and the second focus detection pixel 202).

Figure 5:
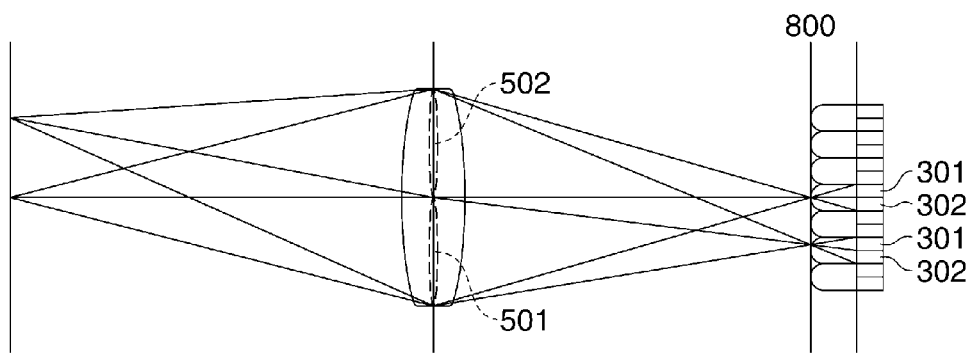
FIG. 5 is a view showing the relationship between the image pickup device shown in FIG. 3A and FIG. 3B and the pupil division.

FIG. 5 is a view showing the relationship between the image pickup device 107 shown in FIG. 3A and FIG. 3B and the pupil division.

The light beams passing through the first partial pupil region 501 and the second partial pupil region 502 pass through the image pickup surface 800, and enters into the pixels of the image pickup device 107 at different angles. Then, the light beams are received by the first focus detection pixel 201 and the second focus detection pixel 202 that are divided into 2×1. Although the pupil area is horizontally divided into two regions in the illustrated example, it may be divided vertically if needed.

As mentioned above, the image pickup device 107 is provided with the first focus detection pixel 201 that receives the light beam passing through the first partial pupil region 501 and the second focus detection pixel 202 that receives the light beam passing through the second partial pupil region 502. Then, an image pickup pixel used for photographing consists of the first focus detection pixel 201 and the second focus detection pixel 202.

It should be noted that the image pickup pixel may be separated from the first focus detection pixel 201 and the second focus detection pixel 201, and the first focus detection pixel 201 and the second focus detection pixel 202 may be arranged in areas except for the image pickup pixel.

Here, the image signals obtained from the first focus detection pixels 201 included in the pixels 200G (200R, 200B) arranged in the image pickup device 107 form an image A (a first focus detection signal). Similarly, the image signals obtained from the second focus detection pixels 202 included in the pixels 200G (200R, 200B) arranged in the image pickup device 107 form an image B (a second focus detection signal).

The focus detection signal generation module 1211 of the CPU 121 calculates an image deviation amount (relative positions) between the image A and the image B, and converts the image deviation amount into a defocus amount (an amount deviated from an in-focus position) to perform the focus detection in the imaging surface phase difference method.

On the other hand, when the pixel signal obtained from the first focus detection pixel 201 and the pixel signal obtained from the second focus detection pixel 202 are added for every pixel 200G (200R, 200G) arranged on the image pickup device 107, an pickup image with the resolution of the valid pixel number N is generated.

Hereafter, the relationship between the image deviation amount and the defocus amount that is found in response to the first and second focus detection signals obtained from the image pickup device 107 shown in FIG. 2 will be described.

Figure 6:
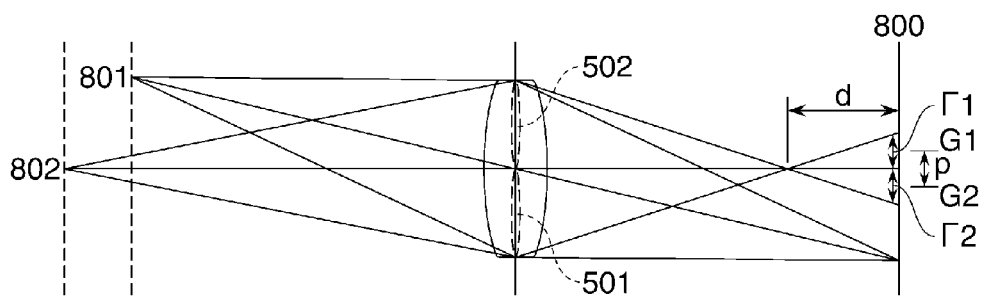
FIG. 6 is a view showing the relationship between an image deviation amount and a defocus amount on an image pickup surface of the image pickup device shown in FIG. 2.

FIG. 6 is a view showing the relationship between the image deviation amount on the image pickup surface 800 of the image pickup device 107 shown in FIG. 2 and the defocus amount.

A distance from a subject-image formed position to the image pickup surface shall be defined as magnitude |d|. In a case of a front focus state where the subject-image formed position is located at the subject side with respect to the image pickup surface 800, the defocus amount d has a minus sign (d<0). On the other hand, in a case of a rear focus state where the subject-image formed position is located at the rear side (i.e., the opposite side to the subject) with respect to the image pickup surface 800, the defocus amount d has a plus sign (d>0). Moreover, in an in-focus state where the subject-image formed position agrees with the image pickup surface 800 (in-focus position), the defocus amount d becomes zero.

As shown in FIG. 6, a subject 801 is in the in-focus state (d=0), and a subject 802 is in the front focus state (d<0). Both the front focus state (d<0) and the rear focus state (d>0) are included in the defocus state (|d|>0).

In the front focus state (d<0), the light beam passing through the first partial pupil region 501 (or the second partial pupil region 502) among the light beams from the subject 802 is once condensed, and then, spreads to a width Γ1 (or Γ2) around a gravity center position G1 (or G2) of the light beam. Then, a blur image is formed on the image pickup surface 800. This blur image is received by the first focus detection pixel 201 (or the second focus detection pixel 202), and is output as the first focus detection signal (or the second focus detection signal).

Accordingly, the first focus detection signal (or the second focus detection signal) will be recorded as the blur image of the subject 802 spread around the gravity center position G1 (or G2) by the width Γ1 (or Γ2) on the image pickup surface 800. The blurring width Γ1 (or Γ2) of the subject image increases nearly proportionally to the magnitude |d| of the defocus amount d.

Similarly, the magnitude |p| of the image deviation amount p between the subject images based on the first focus detection signal and the second focus detection signal (=G1-G2, difference between the gravity center positions) increases nearly proportionally to the magnitude |m| of the defocus amount d. In the rear focus state (d>0), a direction of an image deviation between images based on a first focus detection signal and a second focus detection signal becomes contrary to that in the front focus state.

Accordingly, when a first focus detection signal and a second focus detection signal increase, or when the magnitude of a defocus amount of an image pickup signal that is obtained by adding the first focus detection signal and the second focus detection signal increases, magnitude of an image deviation amount between images based on the first focus detection signal and the second focus detection signal increases.

In the focus detection by the imaging surface phase difference method, correlation quantity that indicates coincidence degree between the first focus detection signal and the second focus detection signal by relatively shifting the focus detection signals by a predetermined amount. Then, an image deviation amount is detected in response to the shift amount at which the correlation quantity (i.e., the coincidence degree) becomes high. That is, the magnitude of the image deviation amount between the images based on the first and second focus detection signals increases as the magnitude of the defocus amount of the image pickup signal (the image signal) increases. The image deviation amount is detected, and the focus detection is performed by converting the image deviation amount concerned into the defocus amount on the basis of the above relationship.

Figure 7:
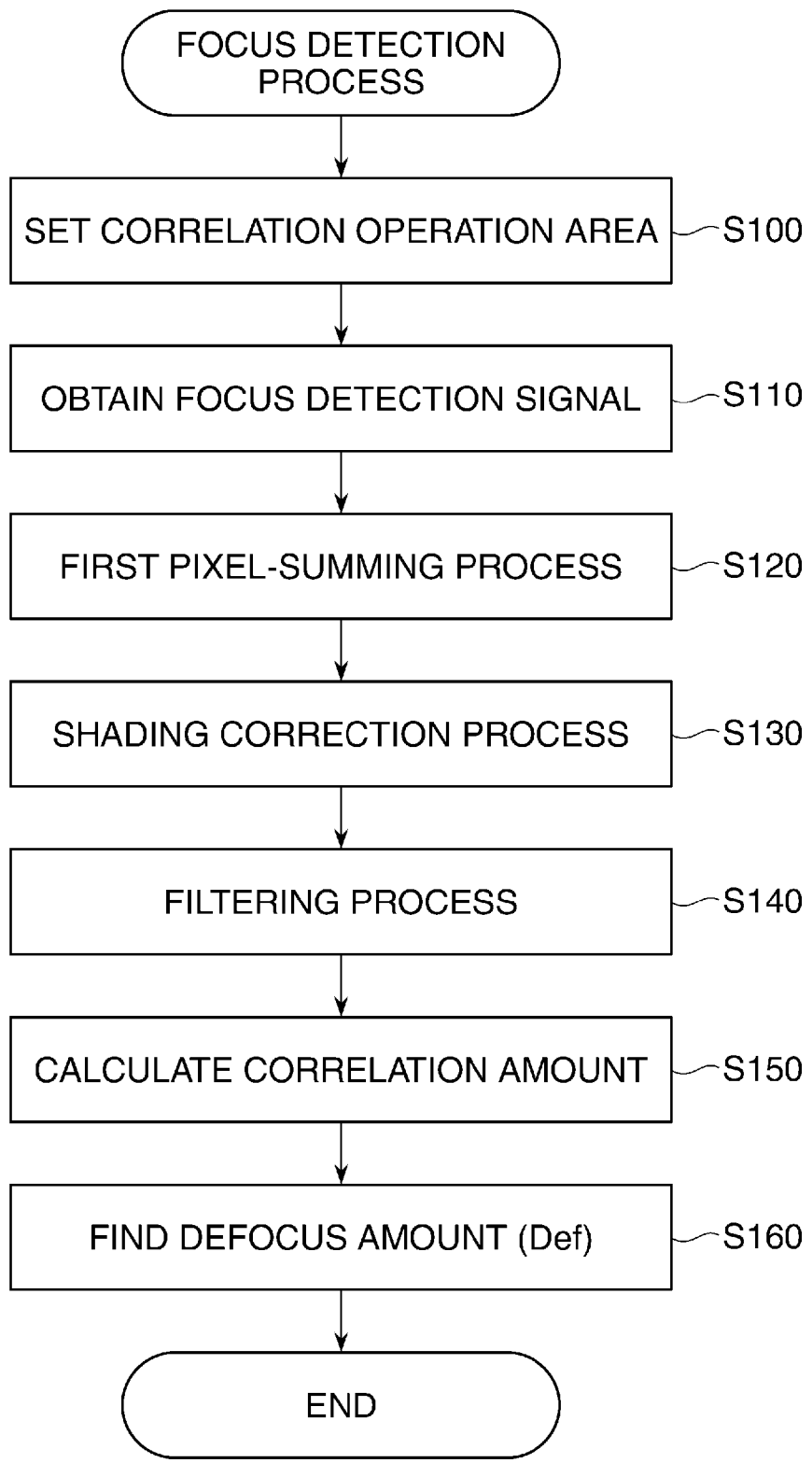
FIG. 7 is a flowchart showing a focus detection process executed by the camera shown in FIG. 1.

FIG. 7 is a flowchart showing a focus detection process executed by the camera shown in FIG. 1. It should be noted that the process of the flowchart in FIG. 7 is executed by the image processing circuit 125 and the CPU 121.

The process concerning the illustrated flowchart starts when a focusing operation start instruction is given by half press (SW1) of the release button by a photographer. When the focus detection process starts, the correlation operation area control module 1212 in the CPU 121 sets the correlation operation area that has the focus detection area (target area) and the shift areas on a screen shown by the image data (step S100).

Figure 8A:
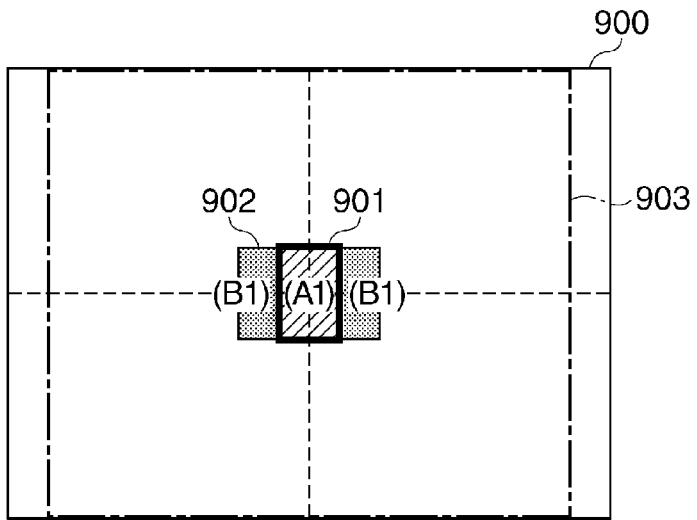
FIG. 8A is a view showing an example of a correlation operation area of which a width is set to a default width that is a first width by a correlation operation area control module shown in FIG. 1.
Figure 8B:
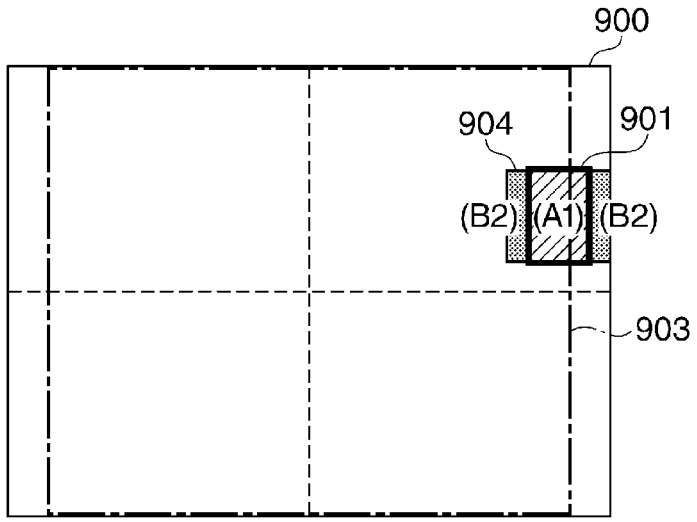
FIG. 8B is a view showing an example of a correlation operation area of which a width is set to a limited width that is a second width by the correlation operation area control module shown in FIG. 1.
Figure 8C:
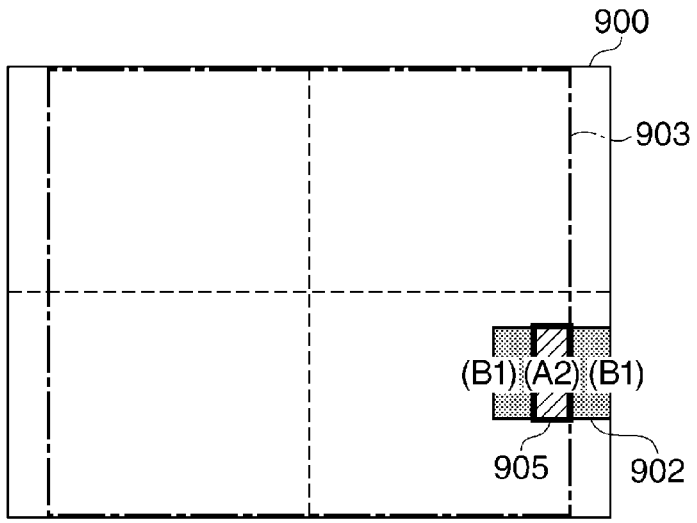
FIG. 8C is a view showing another example of a correlation operation area of which a width is set to the limited width that is the second width by the correlation operation area control module shown in FIG. 1.

FIG. 8A is a view showing an example of a correlation operation area of which a width is set to a default width that is a first width by the correlation operation area control module 1212 shown in FIG. 1. FIG. 8B is a view showing an example of a correlation operation area of which a width is set to a limited width that is a second width by the correlation operation area control module 1212. Moreover, FIG. 8C is a view showing another example of a correlation operation area of which a width is set to the limited width that is the second width by the correlation operation area control module 1212.

In FIG. 8A, the focus detection area (A1) 901 is set to the center of the image pickup area (screen) 900, and the shift areas (B1) 902, which are used for the correlation operation, are adjacently arranged at right and left sides of the focus detection area (A1) 901 concerned. Generally, it is necessary to enlarge the width of the shift area (B1) 902 to increase a bit shift amount in the shift process in order to raise a focus detection performance in a defocusing state.

The shift area (B1) 902 has the width that satisfies the focus detection performance. In the example in FIG. 8A, the focus detection area (A1) 901 is arranged so that the shift process can be performed with the width of the shift area (B1) 902. When the focus detection area (A1) 901 is set as shown in FIG. 8A, the correlation operation area control module 1212 performs the focus detection under a condition where the correlation operation area width is set to the default width.

When the focus detection area (A1) 901 is set inside an area 903 indicated by an alternate long and short dash line, the width of the shift area (B1) 902 that satisfies the focus detection performance is assured.

In FIG. 8B, the focus detection area (A1) 901 is set in an area where the width of the shift area (B1) 902 cannot be maintained (i.e., outside the area 903 indicated by the alternate long and short dash line). In this case, the correlation operation area control module 1212 sets shift areas (B2) 904 of which a width is narrower than that of the shift area (B1) 902, and narrows the correlation operation area width. As a result of this, a range of the defocus amount that the focus detection can be performed is restricted, but an area where the focus detection is possible in the image pickup device is enlarged.

In FIG. 8C, the width of the shift area (B1) 902 is maintained, and a focus detection area (A2) 905 of which a width is narrower than that of the focus detection area (A1) 901 is set. The focus detection area (A2) 905 is set inside the area 903 indicated by the alternate long and short dash line in the same manner as FIG. 8A. The center (visual field center) of the focus detection area (A2) 905 is able to be set in an area closer to an edge of the image pickup area as compared to the case of the focus detection area (A1) 901.

Although each of the examples shown in FIG. 8B and FIG. 8C changes the width of one of the focus detection area and the shift area, both the widths of the focus detection area and the shift area may be narrowed in order to narrow the correlation operation area width.

FIG. 7 is referred again. The focus detection signal generation module 1211 in the CPU 121 obtains a first focus detection signal from the first focus detection pixel corresponding to the correlation operation area, and obtains a second focus detection signal from the second focus detection pixel corresponding to the correlation operation area (step S110).

Next, the CPU 121 executes a three-pixel summing process in the column direction for the first focus detection signal and the second focus detection signal in order to reduce an amount of signal data. Furthermore, the CPU 121 performs a Bayer (RGB) summing process in order to convert an RGB signal into a luminance Y signal (step S120). These two summing processes are collectively called a first pixel summing process.

Next, the image processing circuit 125 applies a shading correction process (optical compensation process) to each of the first focus detection signal and the second focus detection signal under the control of the CPU 121 (step S130).

Here, shading caused by a pupil deviation of the first focus detection signal and the second focus detection signal will be described.

Figure 9A:
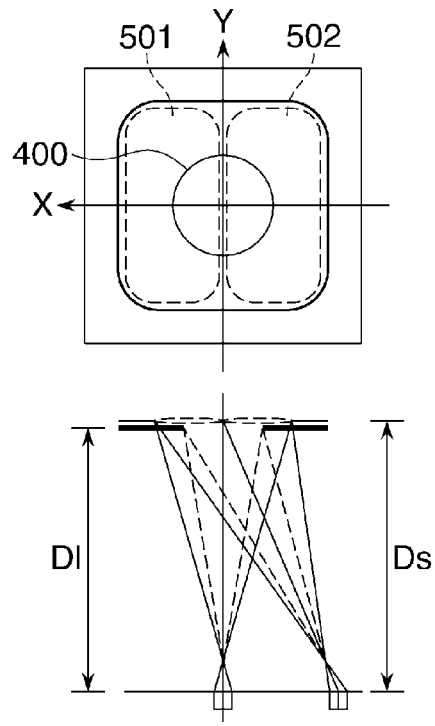
FIG. 9A is a view showing shading caused by the pupil deviation in a case where an exit pupil distance of an imaging optical system is coincident with a setting exit pupil distance of the image pickup device in the camera shown in FIG. 1.
Figure 9B:
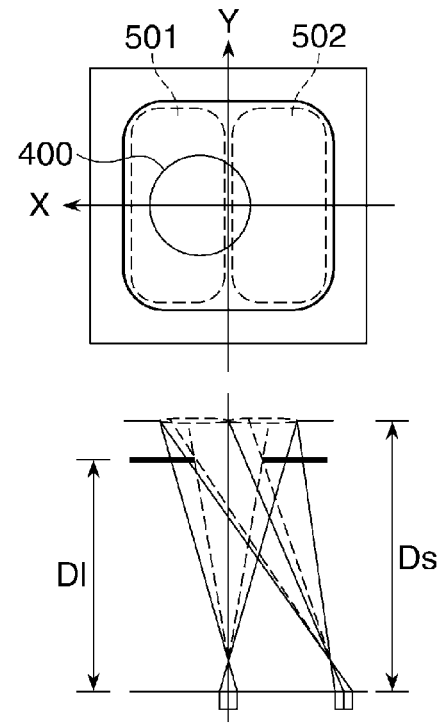
FIG. 9B is a view showing shading caused by the pupil deviation in a case where the exit pupil distance of the imaging optical system is shorter than the setting exit pupil distance of the image pickup device in the camera shown in FIG. 1.

FIG. 9A is a view showing shading caused by the pupil deviation in a case where an exit pupil distance of the imaging optical system is coincident with a setting exit pupil distance of the image pickup device in the camera shown in FIG. 1. FIG. 9B is a view showing shading caused by the pupil deviation in a case where the exit pupil distance of the imaging optical system is shorter than the setting exit pupil distance of the image pickup device. Moreover, FIG. 9C is a view showing shading caused by the pupil deviation in a case where the exit pupil distance of the imaging optical system is longer than the setting exit pupil distance of the image pickup device.

Figure 9C:
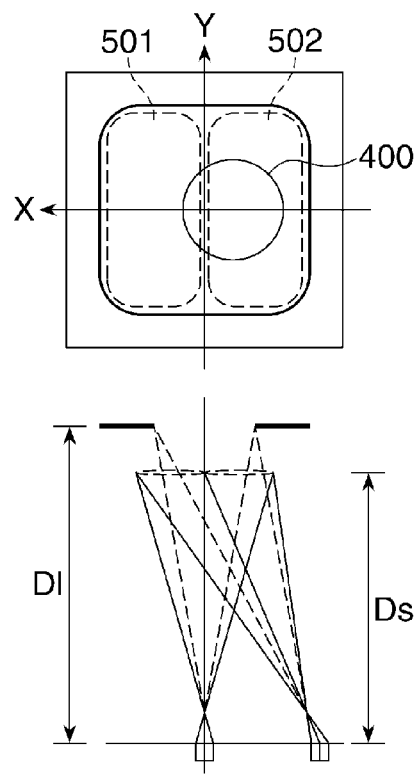
FIG. 9C is a view showing shading caused by the pupil deviation in a case where the exit pupil distance of the imaging optical system is longer than the setting exit pupil distance of the image pickup device in the camera shown in FIG. 1.

FIG. 9A, FIG. 9B, and FIG. 9C show relationships among the first partial pupil region 501 in the peripheral image height of the image pickup device 107, the second partial pupil region 502, and the exit pupil 400 of the imaging optical system. In the case of FIG. 9A, the exit pupil 400 of the imaging optical system is almost equally divided by the first partial pupil region 501 and the second partial pupil region 502.

On the other hand, in the case of FIG. 9B, since the exit pupil 400 of the imaging optical system deviates from the entrance pupil of the image pickup device 107 in the peripheral image height of the image pickup device 107, the exit pupil 400 of the imaging optical system is unequally divided. Similarly, in the case of FIG. 9C, since the exit pupil 400 of the imaging optical system deviates from the entrance pupil of the image pickup device 107 in the peripheral image height of the image pickup device 107, the exit pupil 400 of the imaging optical system is unequally divided.

Inequality between the intensity of the first focus detection signal and the intensity of the second focus detection signal increases as inequality of the pupil division in the peripheral image height increases. This enlarges the difference between the intensities of the first and second focus detection signals. As a result of this, what is called shading that increases one of the intensities of the first and second focus detection signals and decreases the other is caused.

FIG. 7 is referred again. In the process in the step S130, the image processing circuit 125 generates a first shading correction coefficient concerning the first focus detection signal and a second shading correction coefficient concerning the second focus detection signal according to the image height of the focus detection area, the F value of the imaging optical system, and the exit pupil distance. Then, the image processing circuit 125 applies the shading correction process to the first focus detection signal and to the second focus detection signal by multiplying the first shading correction coefficient by the first focus detection signal, and multiplying the second shading correction coefficient by the second focus detection signal to 1.

In the focus detection by the imaging surface phase difference method, a first defocus amount is detected in response to the correlation amount (coincidence degree) between the first focus detection signal and the second focus detection signal. When the shading is caused by the pupil deviation, the correlation amount between the first focus detection signal and the second focus detection signal may drop. Accordingly, in the focus detection by the imaging surface phase difference method, it is preferable to perform the shading correction process in order to improve the correlation amount between the first focus detection signal and the second focus detection signal and to improve focus detection performance.

Next, the image processing circuit 125 applies a filtering process to each of the first focus detection signal and the second focus detection signal (step S140).

Figure 10:
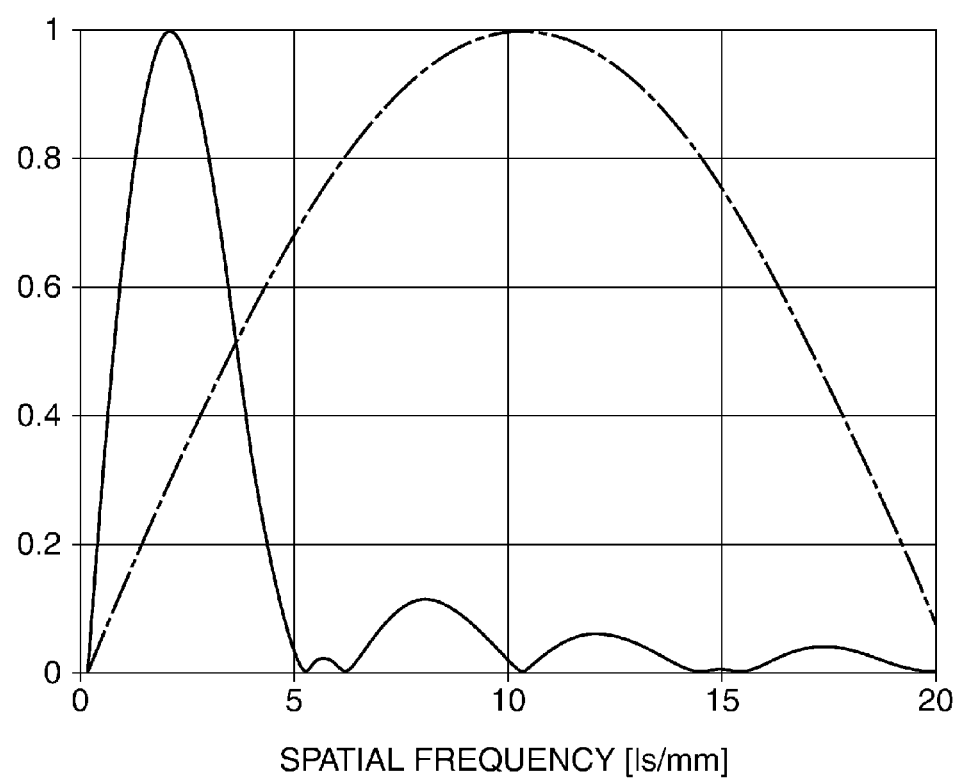
FIG. 10 is a graph showing a pass band of a filtering process performed in the image processing circuit shown in FIG. 1.

FIG. 10 is a graph showing a pass band of the filtering process performed in the image processing circuit 125 shown in FIG. 1.

In FIG. 10, a solid line indicates an example of the pass band in the filtering process. In this example, since the focus detection is performed by the imaging surface phase difference method in the case where the defocus amount is large (large defocusing state), the pass band includes a low frequency band. It should be noted that the pass band for the focus detection may be adjusted to a high frequency band side as indicated by an alternate long and short dash line according to a defocusing state when focusing in not only a large defocusing state but also a small defocusing state.

Next, the CPU 121 calculates the correlation amount (i.e., the evaluation value) showing the coincidence degree by performing the shift process that relatively shifts the first focus detection signal and the second focus detection signal in the pupil division direction after the filtering process (step S150).

The k-th first focus detection signal (k is an integer of one or more) after the filtering process shall be A(k), the k-th second focus detection signal shall be B(k), and a range of the number k corresponding to the focus detection area shall be W. Then, a shift amount by a first shift process shall be s1, and a shift range of the shift amount s1 shall be Γ1. The correlation amount (evaluation value) COR is found by the following formula (1).

$$COR(s_1) = \sum_{k \in W} |A(k) - B(k - s_1)|, s_1 \in \Gamma 1 \quad (1)$$

The CPU 121 generates a shift subtraction signal by subtracting the (k−s1)th second focus detection signal B(k−s1) from the k-th first focus detection signal A(k) by the first shift process using the shift amount s1. Then, the CPU 121 finds the absolute value of the shift subtraction signal, and calculates the correlation amount (evaluation value) COR (s1) by summing the absolute values within the range W corresponding to the focus detection area.

The correlation amount (evaluation value) calculated for each line may be added over a plurality of lines. As mentioned above, the shift area width set in the step S100 is applied to the shift amount s1 of the shift process in the step S150.

Next, the CPU 121 finds the shift amount of a real value where the correlation amount becomes minimum by a sub-pixel operation using the correlation amount (evaluation value), and uses the shift amount as the image deviation amount p1. Then, the CPU 121 finds the defocus amount (Def) by multiplying the image deviation amount p1 by the image height of the focus detection area, the F value of the imaging optical system, and a conversion factor K1 according to the exit pupil distance (step S160). Then, the CPU 121 finishes the focus detection process.

In this way, in the first embodiment of the present invention, since the correlation operation area width is changed according to the location of the focus detection area set in the image pickup area, the focusing control is performed with sufficient accuracy without restricting the settable range of the focus detection area set in the image pickup area. That is, the focus detection is performed as if the image pickup area were enlarged.

Next, a case where the pixel 200G shown in FIG. 2 is divided into two parts in the x-direction and is also divided into two parts in the y-direction (i.e., pixel is divided into 2×2) will be described. In the case where the pixel is divided into 2×2, the correlation operation is needed in not only the x-direction but about the y-direction.

Figure 11A:
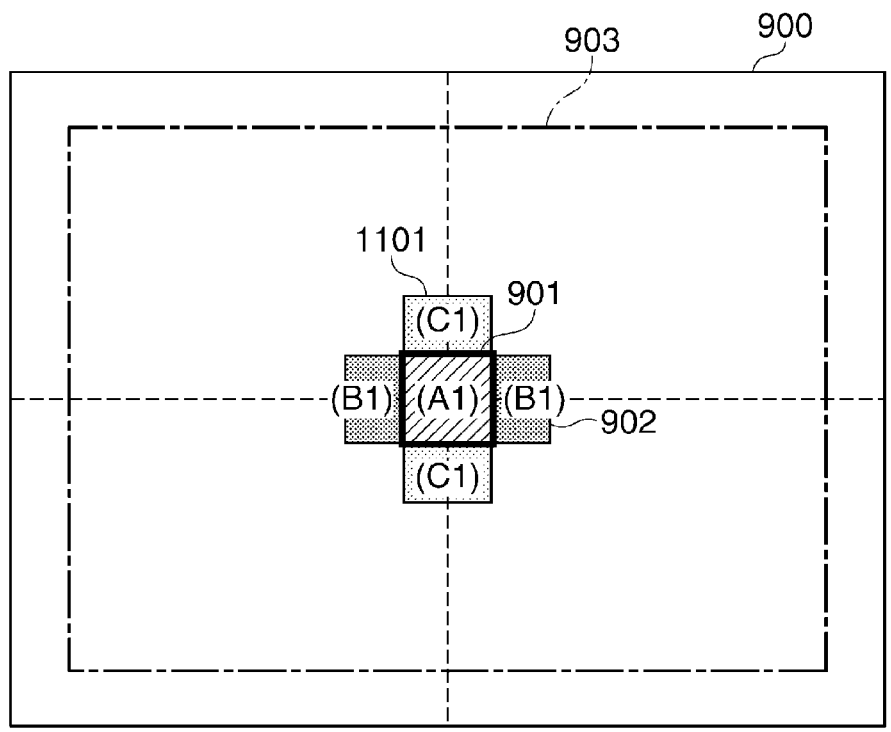
FIG. 11A is a view showing an example of a correlation operation area of which a width is set to the default width that is the first width by the correlation operation area control module shown in FIG. 1.
Figure 11B:
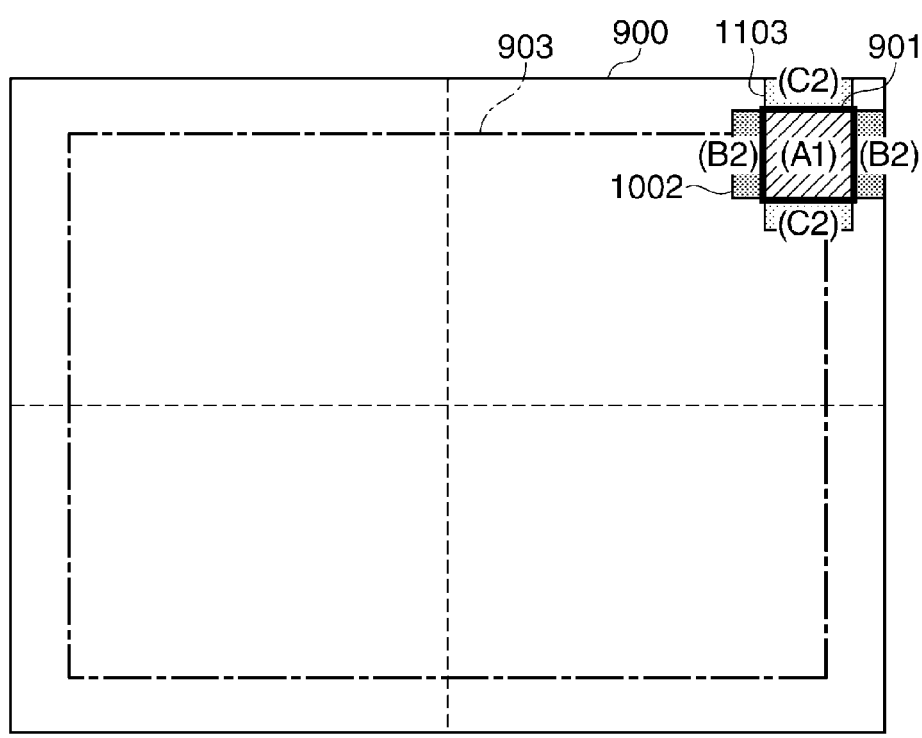
FIG. 11B is a view showing an example of a correlation operation area of which a width is set to the limited width that is the second width by the correlation operation area control module shown in FIG. 1.

FIG. 11A is a view showing an example of a correlation operation area of which a width is set to the default width that is the first width by the correlation operation area control module 1212 shown in FIG. 1. FIG. 11B is a view showing an example of a correlation operation area of which a width is set to the limited width that is the second width by the correlation operation area control module 1212 shown in FIG. 1.

In the example shown in FIG. 11A, a focus detection area (A1) 901 is set at the center of the image pickup area 900, x-direction shift areas (B1) 902 are adjacently arranged at right and left sides of the focus detection area (A1) 901, and y-direction shift areas (C1) 1101 are adjacently arranged at upper and lower sides of the focus detection area (A1) 901. Here, the correlation operation area control module 1212 controls the width of the correlation operation area that consists of the x-direction shift areas (B1) 902 and the focus detection area (A1) 901 in the x-direction. Furthermore, the correlation operation area control module 1212 independently controls the width of the correlation operation area that consists of the y-direction shift areas (C1) 1101 and the focus detection area (A1) 901 in the y-direction.

When the focus detection area (A1) 901 is set inside an area 903 indicated by an alternate long and short dash line, the width of the x-direction shift areas (B1) 902 and the width of the y-direction shift areas (C1) 1101 are maintained.

In the example shown in FIG. 11B, the focus detection area (A1) 901 is set outside the area 903 indicated by the alternate long and short dash line. In this case, the width of the x-direction shift area (B1) 902 and the width of the y-direction shift area (C1) 1101 cannot be maintained. Accordingly, the correlation operation area control module 1212 sets x-direction shift areas (B-2) 1102 and y-direction shift areas (C2) 1103 adjacent to the focus detection area (A1) 901, and sets the correlation operation area width in the x-direction and the y-direction independently.

The x-direction shift area (B1) 901 and the y-direction shift area (C1) 1101 are respectively changed to the x-direction shift area (B-2) 1102 and the y-direction shift area (C2) 1103 while keeping the size of the focus detection area (A1) 901 in FIG. 11B. However, the correlation operation area may be changed by changing the widths of the focus detection area (A1) in the x-direction and the y-direction.

Furthermore, the correlation operation area is changed about the correlation operation in the x-direction and the y-direction. The same process may be performed about two axial directions that are defined by rotating the x-direction and the y-direction by 45 degrees.

When the correlation operation area is controlled in this way, the focusing control is performed with sufficient accuracy without restricting the settable range of the focus detection area in the image pickup area. That is, the focus detection is performed as if the image pickup area were enlarged.

Next, a camera according to the second embodiment of the present invention will be described. It should be noted that a configuration of the camera and a configuration of an image pickup device in the second embodiment are identical to that in the first embodiment.

The camera in the second embodiment has a subject tracking mode as a photographing mode. In the subject tracking mode, a subject as a tracking object, such as a person's face or a moving subject, is recognized from among an image obtained by the image pickup device, and a focus detection area is set on the basis of a position of the subject image on the image pickup device.

Figure 12:
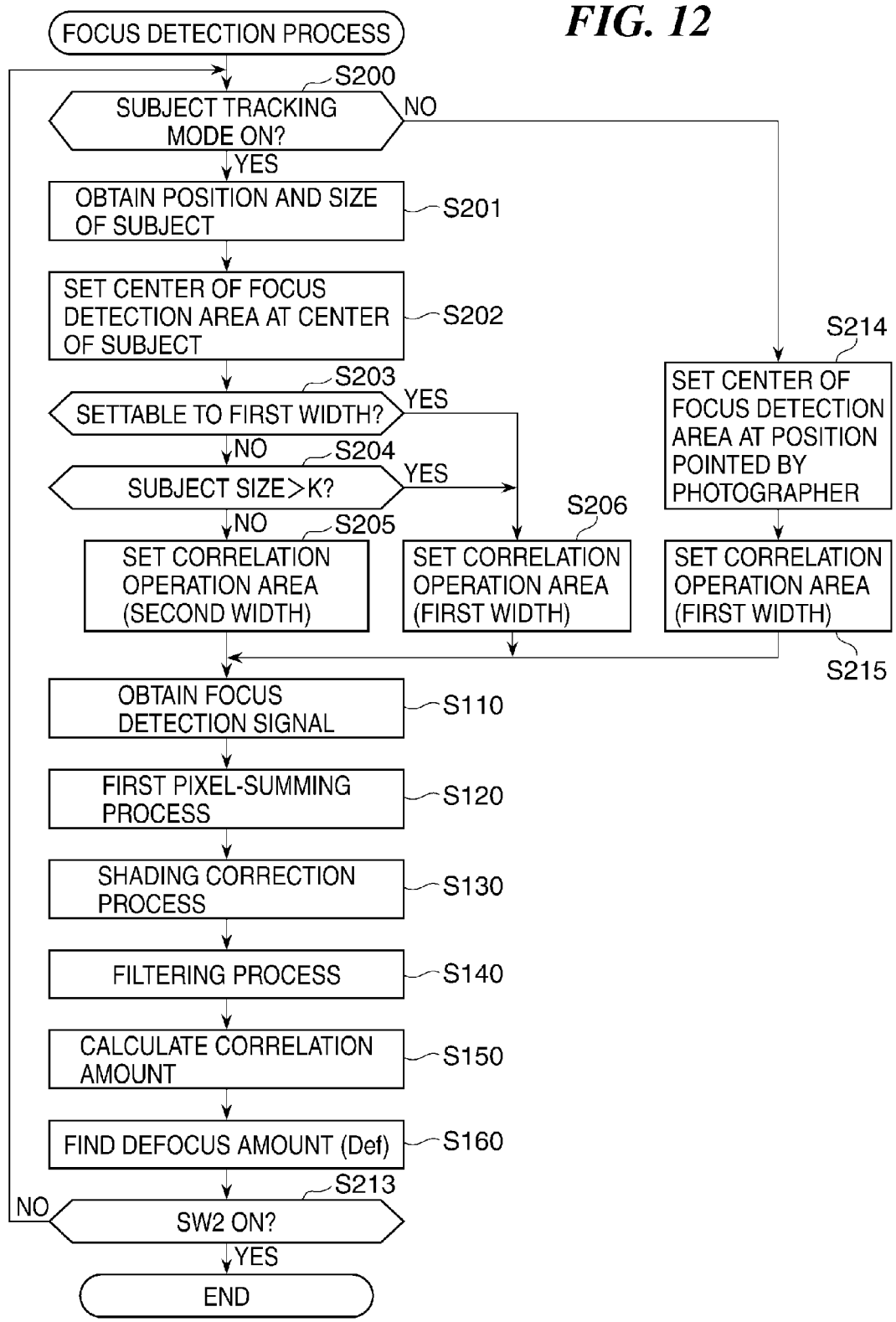
FIG. 12 is a flowchart showing a focus detection process performed by a camera according to a second embodiment of the present invention.

FIG. 12 is a flowchart showing a focus detection process performed by the camera according to the second embodiment of the present invention.

It should be noted that the process of the flowchart in FIG. 12 is executed by the image processing circuit 125 and the CPU 121. Moreover, a step in FIG. 12 that is the same as a step in FIG. 7 is indicated by the same reference number and the description thereof is omitted.

The process concerning the illustrated flowchart starts when a focusing operation start instruction is given by half press (SW1) of the release button by a photographer. When the focus detection process starts, the CPU 121 determines whether the subject tracking mode is set by an operation of the operation switch group 132 (step S200). When the subject tracking mode is set (YES in the step S200), the CPU 121 specifies a position of a subject as a tracking object in an image, and obtains a size of the subject as the tracking object (step S201).

Next, the CPU 121 arranges a center of a focus detection area at the center of the subject as the tracking object specified by the process in the step S201 (step S202). Then, the correlation operation area control module 1212 in the CPU 121 determines whether a width of a correlation operation area is settable to a default width that is a first width (step S203).

Figure 13A:
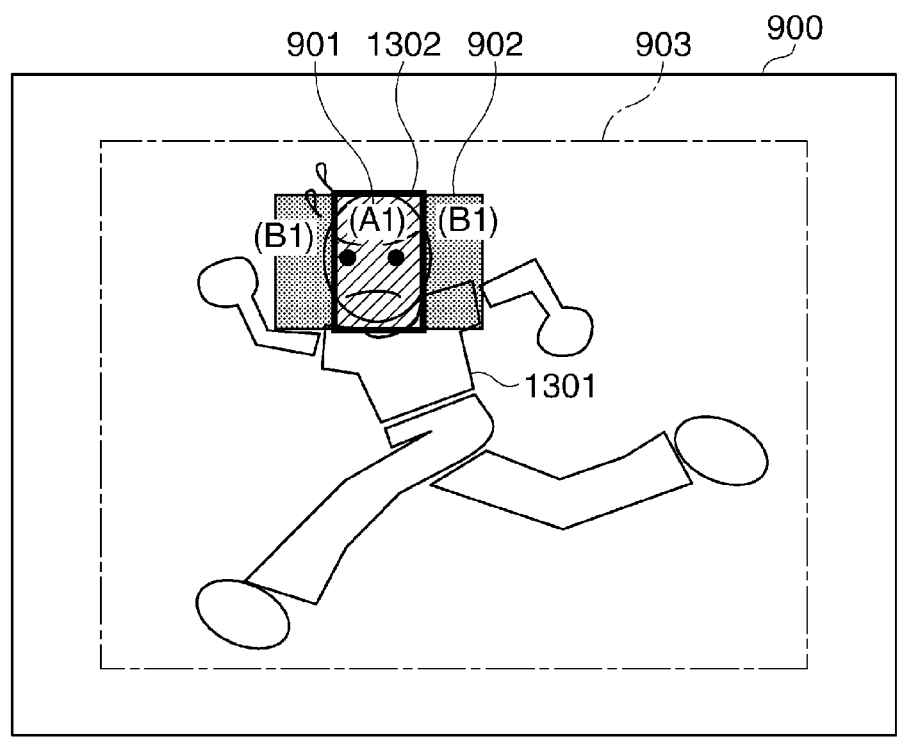
FIG. 13A is a view showing a first example of a correlation operation area setting when a subject tracking mode is set up in the camera according to the second embodiment of the present invention.
Figure 13B:
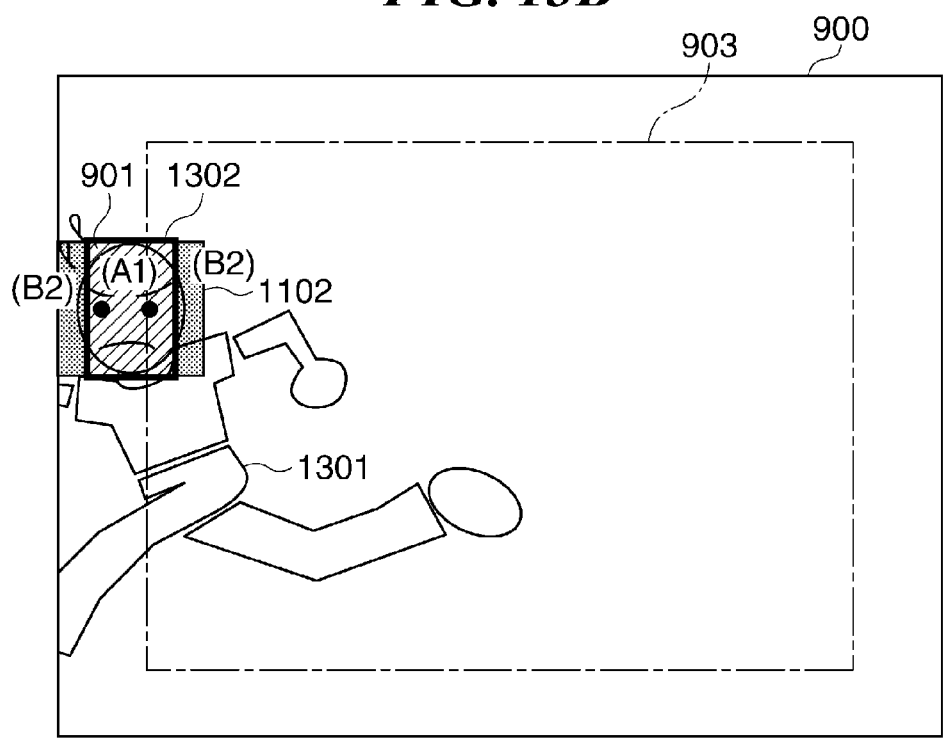
FIG. 13B is a view showing a second example of the correlation operation area setting when the subject tracking mode is set up in the camera according to the second embodiment of the present invention.
Figure 14A:
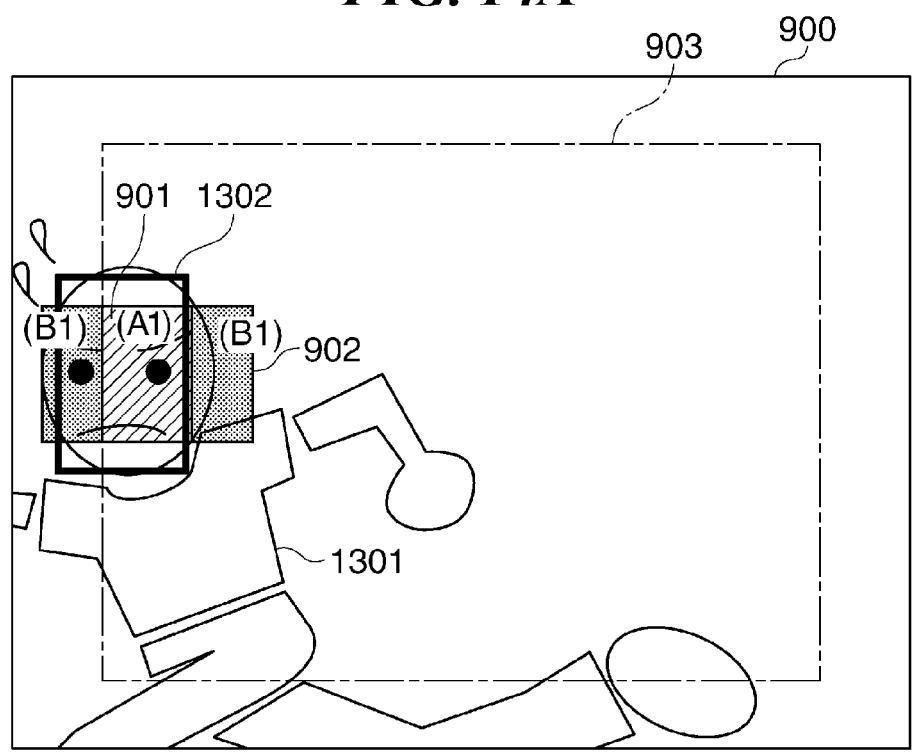
FIG. 14A is a view showing a third example of the correlation operation area setting when the subject tracking mode is set up in the camera according to the second embodiment of the present invention.
Figure 14B:
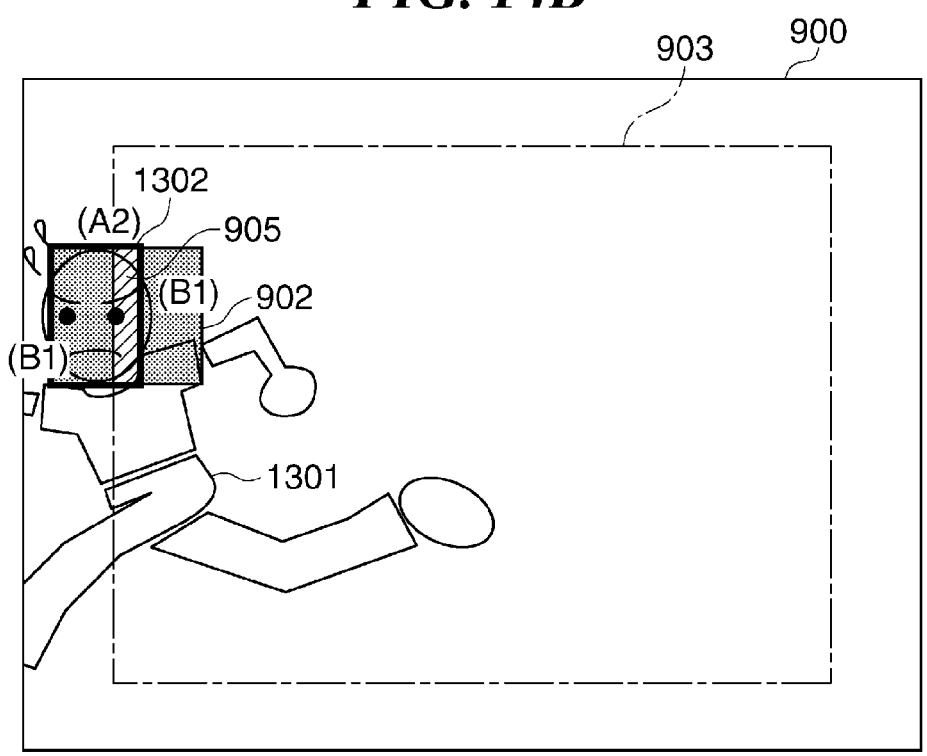
FIG. 14B is a view showing a fourth example of the correlation operation area setting when the subject tracking mode is set up in the camera according to the second embodiment of the present invention.
Figure 15A:
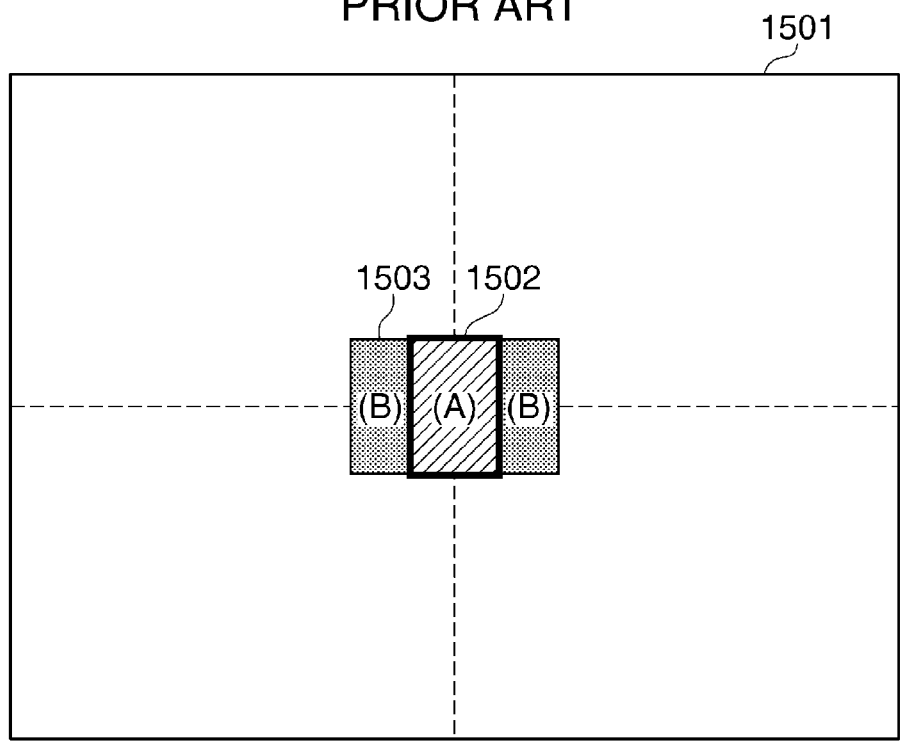
FIG. 15A is a view showing a focus detection area and shift areas that are arranged in an image pickup area in the imaging surface phase difference detection of a conventional image pickup apparatus.
Figure 15B:
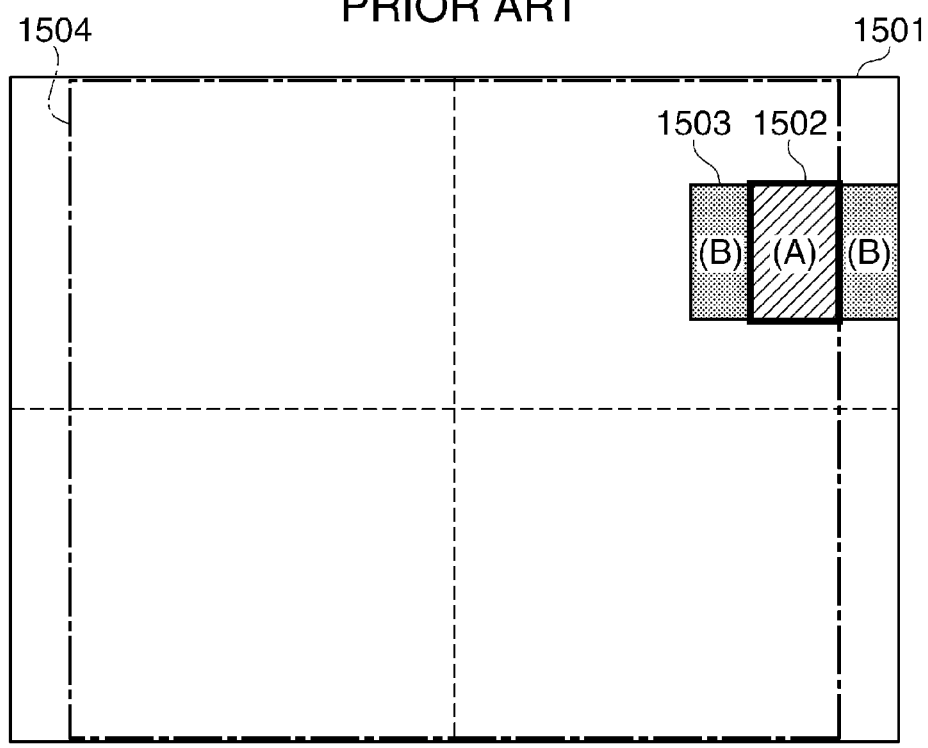
FIG. 15B is a view showing a settable range of the focus detection area in the imaging surface phase difference detection of the conventional image pickup apparatus.

FIG. 13A, FIG. 13B, FIG. 14A, and FIG. 14B are views showing correlation operation area settings when the subject tracking mode is set in the camera according to the second embodiment of the present invention. FIG. 13A is a view showing a first example of the correlation operation area setting. FIG. 13B is a view showing the second example of the correlation operation area setting. Moreover, FIG. 14A is a view showing a third example of the correlation operation area setting. FIG. 14B is a view showing a fourth example of the correlation operation area setting.

When a position and a size of a subject as a tracking object (a face of a person 1301, in this example) are defined by a frame 1302 indicated with a thick line in FIG. 13A, the correlation operation area control module 1212 shall be settable the width of the correlation operation area to the default width. On the other hand, when a position and a size of a subject as a tracking object are defined by a frame 1302 indicated with a thick line in FIG. 13B, the correlation operation area control module 1212 shall not be settable the width of the correlation operation area to the default width.

When the width of the correlation operation area cannot be set to the default width (NO in the step S203), the correlation operation area control module 1212 determines whether the size of the subject (the size of a face) obtained by the process in the step S201 is larger than the predetermined size K (threshold) in step S204.

It should be noted that the size of the subject as the tracking object is equal to or smaller than the predetermined size K in the example shown in FIG. 13B. On the other hand, when a position and a size of a subject as a tracking object are defined by a frame 1302 indicated with a thick line in FIG. 14A, the size of the subject as the tracking object is larger than the predetermined size K.

When the size of the subject 1301 is equal to or smaller than the size K (below a threshold, NO in the step S204), the correlation operation area control module 1212 determines that the width of the correlation operation area cannot be set to the default width, and sets the focus detection area (A1) 901 and the shift areas (B-2) 1102 as the correlation operation area (i.e., sets to the second width in step S205) as shown in FIG. 13B. It should be noted that the correlation operation area control module 1212 may set the focus detection area (A2) 905 and the shift areas (B1) 902 as the correlation operation area as shown in FIG. 14B in the process in the step S205.

When the size of the subject is larger than the size K (YES in the step S204), the correlation operation area control module 1212 determines that the subject as a tracking object exists within the focus detection area even in the setting of the default width, and sets the width of the correlation operation area to the default width that is the first width (step S206) without narrowing the correlation operation area. When the width of the correlation operation area is set to the default width (YES in the step S203), the correlation operation area control module 1212 proceeds with the process to step S206.

In a process in the step S206, since the correlation operation can be executed while setting the width of the correlation operation area to the default width, the focus detection area (A1) 901 and the shift areas (B1) 902 will be set as the correlation operation area as shown in FIG. 13A or FIG. 14A.

When the subject tracking mode is not set (NO in the step S200), the CPU 121 sets the focus detection area around a position pointed by the photographer in the image (step S214). This setting of the focus detection area is described in FIG. 8A, for example. The photographer is able to point a position of the focus detection area within the range 903 indicated with the alternate long and short dash line.

Next, the correlation operation area control module 1212 in the CPU 121 sets the focus detection area (A1) 901 and the shift areas (B1) 902 as the correlation operation area (step S215) in the same manner as described for the step S206.

Following the process in the step S205, S206, or S215, the process in the steps S110 through S160 described in FIG. 7 is performed. Then, the CPU 121 determines whether the release button has been fully pressed (SW2 ON) that means a photographing instruction (step S213). When the SW2 is OFF (NO in the step S213), the CPU 121 returns the process to the step S200 and starts the focus detection process in a newly obtained frame. On the other hand, when the SW2 is ON (YES in the step S213), the CPU 121 finishes the focus detection process and transfers to a photographing operation.

As mentioned above, in the second embodiment of the present invention, when the subject tracking mode is set, the width of the correlation operation area is changed according to a size and a position of a subject as a tracking object. Accordingly, the focusing control is performed with sufficient accuracy without restricting the settable range of the focus detection area set in the image pickup area even when tracking a subject. That is, the focus detection is performed as if the image pickup area were enlarged.

Particularly in the subject tracking mode, since the subject that is the tracking object often exists near the in-focus position, the defocus amount does not change significantly. Accordingly, even when the bit shift amount in the shift process becomes large, the defocus amount is found. Accordingly, the correlation operation area control does not adversely affect the tracking of the subject.

It is clear that the CPU 121 and the image processing circuit 125 function as the area setting unit, the focus detection unit, and the control unit in the example shown in FIG. 1 according to the above-mentioned description.

Although the embodiments of the invention have been described, the present invention is not limited to the above-mentioned embodiments, the present invention includes various modifications as long as the concept of the invention is not deviated.

For example, the functions of the above mentioned embodiments may be achieved as a control method that is executed by an image pickup apparatus. Moreover, the functions of the above mentioned embodiments may be achieved as a control program that is executed by a computer with which the image pickup apparatus is provided. It should be noted that the control program is recorded into a computer-readable storage medium, for example.

Each of the above-mentioned control method and control program includes an area setting step, a focus detection step, and a control step at least.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-042635, filed Mar. 5, 2014, which is hereby incorporated by reference herein in its entirety.

What is claimed is:

1. An image pickup apparatus comprising:
an image pickup device on which pixels each of which is provided with a plurality of sub-pixels that respectively receive light beams passing through different pupil areas of an imaging optical system are arranged;
at least one processor or circuit configured to perform the operations of the following units:
an area setting unit configured to set a target area for detecting a defocus amount as a focus detection area in an image indicated by an image signal output from said image pickup device, to set at least one shift area for calculating a correlation amount of image signals output from the plurality of sub-pixels, and to define a correlation operation area including the focus detection area and the at least one shift area;
a focus detection unit configured to find, in the correlation operation area, the correlation amount by applying a shift process to image signals output from the plurality of sub-pixels, and to calculate the defocus amount in response to the correlation amount concerned; and
a control unit configured to set the width of the at least one shift area to a predetermined width when the focus detection area is set at a position where the correlation operation area can be set with a first width in the image, and to set the width of the at least one shift area to a width narrower than the predetermined width to set the width of the correlation operation area to a second width narrower than the first width when the focus detection area is set at a position where the correlation operation area cannot be set with the first width.

2. The image pickup apparatus according to claim 1, wherein said control unit reduces both of the width of the focus detection area and the width of the at least one shift area to set the width of the correlation operation area to the second width when the focus detection area is set at a position where the correlation operation area cannot be set with the first width.

3. The image pickup apparatus according to claim 1, wherein said area setting unit sets the focus detection area according to a size and a position of a subject when a subject tracking mode for tracking a subject is set, and wherein said control unit sets the correlation operation area with the first width when the correlation operation area can be set with the first width.

4. The image pickup apparatus according to claim 3, wherein said control unit determines whether the size of the subject is larger than a predetermined threshold, and sets the correlation operation area with the first width when the size of the subject is larger than the predetermined threshold.

5. The image pickup apparatus according to claim 4, wherein said control unit sets the correlation operation area with the second width when the size of the subject is not larger than the predetermined threshold.

6. The image pickup apparatus according to claim 3, wherein said control unit sets, when the subject tracking mode is not set, the focus detection area at a predetermined position and sets the correlation operation area with the first width.

7. A control method for an image pickup apparatus having an image pickup device on which pixels each of which is provided with a plurality of sub-pixels that respectively receive light beams passing through different pupil areas of an imaging optical system are arranged, and detecting a focusing state based on an output of the image pickup device, the control method comprising:

an area setting step of setting a target area for detecting a defocus amount as a focus detection area in an image indicated by an image signal from said image pickup device, of setting at least one shift area for calculating a correlation amount of image signals output from the plurality of sub-pixels, and of defining a correlation operation area including the focus detection area and the at least one shift area;

a focus detection step of finding, in the correlation operation area, the correlation amount by applying a shift process to image signals output from the plurality of sub-pixels, and calculating the defocus amount in response to the correlation amount concerned; and a control step of setting the width of the at least one shift area to a predetermined width when the focus detection area is set at a position where the correlation operation area can be set with a first width in the image, and of setting the width of the at least one shift area to a width narrower than the predetermined width to set the width of the correlation operation area to a second width narrower than the first width when the focus detection area is set at a position where the correlation operation area cannot be set with the first width.

8. A non-transitory computer-readable storage medium storing a control program causing a computer to execute a control method for an image pickup apparatus having an image pickup device on which pixels each of which is provided with a plurality of sub-pixels that respectively receive light beams passing through different pupil areas of an imaging optical system, and detecting a focusing state based on an output of the image pickup device, the control method comprising:

an area setting step of setting a target area for detecting a defocus amount as a focus detection area in an image indicated by an image signal from said image pickup device, of setting at least one shift area for calculating a correlation amount of image signals output from the plurality of sub-pixels, and of defining a correlation operation area including the focus detection area and the at least one shift area;

a focus detection step of finding, in the correlation operation area, the correlation amount by applying a shift process to image signals output from the plurality of sub-pixels, and calculating the defocus amount in response to the correlation amount concerned; and a control step of setting the width of the at least one shift area to a predetermined width when the focus detection area is set at a position where the correlation operation area can be set with a first width in the image, and of setting the width of the at least one shift area to a width narrower than the predetermined width to set the width of the correlation operation area to a second width narrower than the first width when the focus detection area is set at a position where the correlation operation area cannot be set with the first width.

9. An image pickup apparatus comprising:

an image pickup device on which pixels each of which is provided with a plurality of sub-pixels that respectively receive light beams passing through different pupil areas of an imaging optical system are arranged;

at least one processor or circuit configured to perform the operations of the following units:

an area setting unit configured to set a target area for detecting a defocus amount as a focus detection area in an image indicated by an image signal output from said image pickup device, to set at least one shift area for calculating a correlation amount of image signals output from the plurality of sub-pixels, and to define a correlation operation area including the focus detection area and the at least one shift area;

a focus detection unit configured to find, in the correlation operation area, the correlation amount by applying a shift process to image signals output from the plurality of sub-pixels, and to calculate the defocus amount in response to the correlation amount concerned; and a control unit configured to set, when the focus detection area set according to a tracked subject reaches an edge of a settable range of the focus detection area set in an image pickup area, the width of the focus detection area so that the width of the focus detection area is narrower than that of before the reaching of the edge of the settable range of the focus detection area.

10. A control method for an image pickup apparatus having an image pickup device on which pixels each of which is provided with a plurality of sub-pixels that respectively receive light beams passing through different pupil areas of an imaging optical system are arranged, the control method comprising:

an area setting step of setting a target area for detecting a defocus amount as a focus detection area in an image indicated by an image signal output from said image pickup device, of setting at least one shift area for calculating a correlation amount of image signals output from the plurality of sub-pixels, and of defining a correlation operation area including the focus detection area and the at least one shift area;

a focus detection step of finding, in the correlation operation area, the correlation amount by applying a shift process to image signals output from the plurality of sub- pixels, and calculating the defocus amount in response to the correlation amount concerned; and a control step of setting, when the focus detection area set according to a tracked subject reaches an edge of a settable range of the focus detection area set in an image pickup area, the width of the focus detection area so that the width of the focus detection area is narrower than that of before the reaching of the edge of the settable range of the focus detection area.

11. A non-transitory computer-readable storage medium storing a control program causing a computer to execute a control method for an image pickup apparatus having an image pickup device on which pixels each of which is provided with a plurality of sub-pixels that respectively receive light beams passing through different pupil areas of an imaging optical system are arranged, the control method comprising:
- an area setting step of setting a target area for detecting a defocus amount as a focus detection area in an image indicated by an image signal output from said image pickup device, of setting at least one shift area for calculating a correlation amount of image signals output from the plurality of sub-pixels, and of defining a correlation operation area including the focus detection area and the at least one shift area;
- a focus detection step of finding, in the correlation operation area, the correlation amount by applying a shift process to image signals output from the plurality of sub- pixels, and calculating the defocus amount in response to the correlation amount concerned; and
- a control step of setting, when the focus detection area set according to a tracked subject reaches an edge of a settable range of the focus detection area set in an image pickup area, the width of the focus detection area so that the width of the focus detection area is narrower than that of before the reaching of the edge of the settable range of the focus detection area.

\* \* \* \* \*